US008034648B1

(12) United States Patent  
Ha et al.

(10) Patent No.: US 8,034,648 B1
(45) Date of Patent: Oct. 11, 2011

(54) EPITAXIAL REGROWTH IN A DISTRIBUTED FEEDBACK LASER

(75) Inventors: Yuk Lung Ha, San Jose, CA (US); David Bruce Young, Oakland, CA (US); Ashish Verma, San Jose, CA (US); Roman Dimitrov, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 30 days.

(21) Appl. No.: 11/749,007

(22) Filed: May 15, 2007

Related U.S. Application Data

(60) Provisional application No. 60/747,297, filed on May 15, 2006.

(51) Int. Cl.
  H01L 21/00 (2006.01)
  H01L 21/31 (2006.01)
  H01L 21/469 (2006.01)
(52) U.S. Cl. ............... 438/39; 438/505; 438/760
(58) Field of Classification Search .......... 438/478–509, 438/39–41, 760
  See application file for complete search history.

(56) References Cited

U.S. PATENT DOCUMENTS

| | | | |
|---|---|---|---|
| 4,092,659 A | | 5/1978 | Ettenberg |
| 4,740,987 A | * | 4/1988 | McCall et al. ............ 372/96 |
| 4,859,628 A | * | 8/1989 | Knight et al. ............ 117/57 |
| 4,951,292 A | | 8/1990 | Kuindersma et al. |
| 5,208,821 A | * | 5/1993 | Berger et al. ............ 372/46.012 |
| 5,450,432 A | | 9/1995 | Okuda |
| 5,585,309 A | * | 12/1996 | Mori et al. ............ 438/43 |
| 5,675,601 A | * | 10/1997 | Karakida et al. ........ 372/46.01 |
| 5,793,787 A | * | 8/1998 | Meyer et al. ............ 372/45.01 |
| 5,926,493 A | * | 7/1999 | O'Brien et al. .......... 372/50.11 |
| 6,111,275 A | * | 8/2000 | Hata ..................... 257/97 |
| 6,219,366 B1 | * | 4/2001 | Furushima .............. 372/50.1 |
| 6,477,283 B1 | * | 11/2002 | Shimizu et al. ......... 385/3 |

(Continued)

FOREIGN PATENT DOCUMENTS
JP 2000-340894 12/2000

OTHER PUBLICATIONS

Sexl, M., Böhm G., Maier, M., Tränke, G., Weimann, G., & Abstreiter, G. (1997). MBE growth of metamorphic In(Ga)AIAs buffers. 1997 IEEE International Symposium on Compound Semiconductors, IEEE, 49-52.*

(Continued)

*Primary Examiner* — Savitri Mulpuri
*Assistant Examiner* — Calvin Choi
(74) *Attorney, Agent, or Firm* — Maschoff Gilmore & Israelsen

(57) ABSTRACT

Optimizing the regrowth over epitaxial layers during manufacture of a distributed feedback laser. In one example embodiment, a method for depositing an InP regrowth layer on an epitaxial base portion of a distributed feedback laser includes growing a first portion of the regrowth layer at an initial substrate temperature of approximately 580 degrees Celsius to a thickness between approximately 300 Angstroms and approximately 900 Angstroms, increasing the substrate temperature from the initial substrate temperature to an increased substrate temperature of approximately 660 degrees Celsius, growing a second portion of the regrowth layer at the increased substrate temperature, doping a first part of an uppermost layer of the regrowth layer at a concentration of approximately 8.00*10^17/cm3 at the increased substrate temperature, and doping a second part of the uppermost layer of the regrowth layer at a concentration between approximately 1.90*10^18/cm3 and approximately 2.00*10^18/cm3 at the increased substrate temperature.

17 Claims, 4 Drawing Sheets

170

| Layer | Parameter | Col. 1<br>Designs A, C | Col. 2<br>Designs B, D |
|---|---|---|---|
| 172 — Low-Temp Initiation Layer | Substrate temp (degC) | 580 | 580 |
| | Layer Thickness (Ang) | 300 | 900 |
| | [Zn] norm. to wfr 3308 | 1/3 | 1 |
| 176 — Temp-Ramp Layer | Temp-ramp shape | linear | linear |
| | Doping-ramp shape | quadratic | linear |
| 180 — InP:Zn Layer | Substrate temp (degC) | 660 | 660 |
| | [Zn] first 0.5um | 8.00E+17 | 8.00E+17 |
| | [Zn] remainder | 1.90E+18 | 2.00E+18 |
| 184 — InGaAs Contact Layer | [Zn] | 1.10E+19 | 1.60E+19 |
| | Lattice matched? | YES | YES |
| | Thickness (nm) | 200 | 200 |
| 188 — InP Cap Layer | [Zn] | 2.00E+18 | 2.00E+18 |
| | Thickness (nm) | 50 | 50 |
| 192 — Cool Down | Final Temp (degC) | 300 | 300 |
| | TBP | YES | YES |

U.S. PATENT DOCUMENTS

| | | |
|---|---|---|
| 6,618,410 B1 | 9/2003 | Fischer et al. |
| 2002/0037024 A1* | 3/2002 | Huang ............................ 372/50 |
| 2002/0114367 A1* | 8/2002 | Stintz et al. ..................... 372/45 |
| 2002/0117675 A1 | 8/2002 | Mascarenhas |
| 2003/0002557 A1 | 1/2003 | Eng et al. |
| 2003/0179795 A1 | 9/2003 | Moriya et al. |
| 2004/0057483 A1* | 3/2004 | Takemi et al. .................. 372/45 |
| 2004/0079967 A1* | 4/2004 | Shakuda et al. ............. 257/200 |
| 2004/0086017 A1 | 5/2004 | Yoshida et al. |
| 2004/0190835 A1 | 9/2004 | Burdick et al. |
| 2005/0031000 A1* | 2/2005 | Botez ............................. 372/47 |

OTHER PUBLICATIONS

Sexl, M., Böhm G., Maier, M., Tränke, G., Weimann, G., & Abstreiter, G. (1997). MBE growth of metamorphic In(Ga)AlAs buffers. 1997 IEEE International Symposium on Compound Semiconductors, IEEE, 49-52.*

Sudo, Tsurugi, et al., Semiconductor Laser Having Low Stress Passivation Layer, U.S. Appl. No. 11/749,047, filed May 15, 2007.

Young, David Bruce, et al., Semiconductor Laser Having a Doped Active Layer, U.S. Appl. No. 11/749,013, filed May 15, 2007.

Verma, Ashish K., et al., Thin INP Spacer Layer in a High Speed Laser for Reduced Lateral Current Spreading, U.S. Appl. No. 11/749,033, filed May 15, 2007.

Dimitrov, Roman, et al., Method for Applying Protective Laser Facet Coatings, U.S. Appl. No. 11/749,052, filed May 15, 2007.

Dimitrov, Roman, et al., High Resistivity Engineered Laser Facet Coatings, U.S. Appl. No. 11/749,057, filed May 15, 2007.

Dimitrov, Roman et al., Laser Facet Pre-Coating Etch for Controlling Leakage Current, U.S. Appl. No. 11/749,061, filed May 15, 2007.

U.S. Appl. No. 11/749,013, Mail Date Oct. 29, 2008, Office Action.

U.S. Appl. No. 11/749,013, Mail Date Feb. 25, 2009, Notice of Allowance.

U.S. Appl. No. 11/749,047, Mail Date Aug. 12, 2008, Office Action.

U.S. Appl. No. 11/749,047, Mail Date Feb. 6, 2009, Notice of Allowance.

U.S. Appl. No. 11/749,033, Mail Date Jun. 2, 2008, Office Action.

U.S. Appl. No. 11/749,033, Mail Date Jan. 13, 2009, Notice of Allowance.

U.S. Appl. No. 11/749,057, Mail Date Dec. 11, 2008, Office Action.

* cited by examiner

| | Layer | Parameter | Col. 1 Designs A, C | Col. 2 Designs B, D |
|---|---|---|---|---|
| 172 | Low-Temp Initiation Layer | Substrate temp (degC) | 580 | 580 |
| | | Layer Thickness (Ang) | 300 | 900 |
| | | [Zn] norm. to wfr 3308 | 1/3 | 1 |
| 176 | Temp-Ramp Layer | Temp-ramp shape | linear | linear |
| | | Doping-ramp shape | quadratic | linear |
| | | Substrate temp (degC) | 660 | 660 |
| 180 | InP-Zn Layer | [Zn] first 0.5um | 8.00E+17 | 8.00E+17 |
| | | [Zn] remainder | 1.90E+18 | 2.00E+18 |
| | | [Zn] | 1.10E+19 | 1.60E+19 |
| 184 | InGaAs Contact Layer | Lattice matched? | YES | YES |
| | | Thickness (nm) | 200 | 200 |
| | | [Zn] | 2.00E+18 | 2.00E+18 |
| 188 | InP Cap Layer | Thickness (nm) | 50 | 50 |
| | | Final Temp (degC) | 300 | 300 |
| 192 | Cool Down | TBP | YES | YES |

Fig. 4

EPITAXIAL REGROWTH IN A DISTRIBUTED FEEDBACK LASER

CROSS-REFERENCE TO RELATED APPLICATION

This application claims priority to U.S. Provisional Patent Application Ser. No. 60/747,297, filed on May 15, 2006, which is incorporated herein by reference in its entirety.

BACKGROUND

1. The Field of the Invention

The present invention generally relates to semiconductor optical devices. In particular, the present invention relates to a method for optimizing the regrowth over epitaxial layers during manufacture of a distributed feedback laser.

2. The Related Technology

Semiconductor lasers are currently used in a variety of technologies and applications, including communications networks. One type of semiconductor laser is the distributed feedback ("DFB") laser. The DFB laser produces a stream of coherent, monochromatic light by stimulating photon emission from a solid state material. DFB lasers are commonly used in optical transmitters, which are responsible for modulating electrical signals into optical signals for transmission via an optical communication network.

Generally, a DFB laser includes a positively or negatively doped bottom layer or substrate, and a top layer that is oppositely doped with respect to the bottom layer. An active region, bounded by confinement regions, is included at the junction of the two layers. These structures together form the laser body. A coherent stream of light that is produced in the active region of the DFB laser can be emitted through either longitudinal end, or facet, of the laser body. One facet is typically coated with a high reflective material that redirects photons produced in the active region toward the other facet in order to maximize the emission of coherent light from that facet end. A grating is included in either the top or bottom layer to assist in producing a coherent photon beam. DFB lasers are typically known as single mode devices as they produce light signals at one of several distinct wavelengths, such as 1,310 nm or 1,550 nm. Such light signals are appropriate for use in transmitting information over great distances via an optical communications network.

One challenge relating to DFB and similar lasers involves the deposition of a regrowth layer atop the DFB laser device during manufacture. Typically, such regrowth layers are grown at relatively high temperatures in order to prevent the formation of impurities at the regrowth interface within the laser. These impurities, such as silicon and oxygen, can undesirably compromise the operation of the laser once manufacture and testing are complete.

However, high temperature regrowth can cause damage to the grating layer of the DFB laser by causing it to reflow, which can destroy its structure, rendering the laser unusable.

Therefore, a need exists in the art for a method for control regrowth over epitaxial layers in a DFB laser so as to prevent the formation of impurities therein, while preserving the morphology and integrity of the laser grating.

BRIEF SUMMARY OF SOME EXAMPLE EMBODIMENTS

In general, example embodiments of the invention relate to optimizing the regrowth over epitaxial layers during manufacture of a distributed feedback laser. Some example embodiments of the invention help protect the grating layer from damage while at the same time preventing the formation of impurities at the regrowth interface. Further, example embodiments of the present method can assist in eliminating performance shifts, such as lasing wavelength, and laser degradation during the operational life of the laser, as well as minimizing excessive quantities of dopant near the laser active region.

In one example embodiment, a method for depositing an InP regrowth layer on an epitaxial base portion of a distributed feedback laser includes growing a first portion of the regrowth layer at an initial substrate temperature of approximately 580 degrees Celsius to a thickness between approximately 300 Angstroms and approximately 900 Angstroms, increasing the substrate temperature from the initial substrate temperature to an increased substrate temperature of approximately 660 degrees Celsius, growing a second portion of the regrowth layer at the increased substrate temperature, doping a first part of an uppermost layer of the regrowth layer at a concentration of approximately $8.00*10^{17}/cm3$ at the increased substrate temperature, and doping a second part of the uppermost layer of the regrowth layer at a concentration between approximately $1.90*10^{18}/cm3$ and approximately $2.00*10^{18}/cm3$ at the increased substrate temperature.

These and other aspects of example embodiments of the present invention will become more fully apparent from the following description and appended claims.

BRIEF DESCRIPTION OF THE DRAWINGS

To further clarify the above and other advantages and features of the present invention, a more particular description of the invention will be rendered by reference to specific embodiments thereof that are illustrated in the appended drawings. It is appreciated that these drawings depict only typical embodiments of the invention and are therefore not to be considered limiting of its scope. The invention will be described and explained with additional specificity and detail through the use of the accompanying drawings in which:

FIG. 4 is a collection of data relating to a DFB laser and a method for regrowth thereon, in accordance with one embodiment.

DETAILED DESCRIPTION OF SOME EXAMPLE EMBODIMENTS

Reference will now be made to figures wherein like structures will be provided with like reference designations. It is understood that the drawings are diagrammatic and schematic representations of exemplary embodiments of the invention, and are not limiting of the present invention nor are they necessarily drawn to scale.

FIGS. 1-4 depict various features of embodiments of the present invention, which is generally directed to a method for producing an optimized doping profile for regrowth of layers over an epitaxial base portion during manufacture of a distributed feedback laser. This method involves, in one embodiment, simultaneously controlling both p-type doping and regrowth temperature during the procedure so as protect the grating layer from damage while at the same time preventing the formation of impurities at the regrowth interface. Further, embodiments of the present method assist in eliminating performance shifts, such as lasing wavelength, and laser degradation during the operational life of the laser, as well as minimizing excessive quantities of dopant near the laser active region.

In brief overview, the quality of the material grown immediately above the grating layer is key to good current-voltage performance of the laser. The most common impurities at a regrowth interface are n-type dopants which, if not properly compensated, can cause high resistance and non-linear voltage behaviors in a regrowth where the epitaxial base portion material at the surface and the regrowth material are both p-doped material. This can cause heating and device performance degradation.

In the regrowth process, there are two imperatives in conflict. Best practices in crystal growth dictate that the sample be outgassed at a high temperature to remove impurities and contaminants from the surface before growth is initiated. In the case of a grating regrowth, however, the imperative is to minimize the thermal cycle before growth is initiated in order to maintain the surface corrugation of the grating. Too much of a thermal outgas step will cause the grating to reflow, impacting the reflectivity of the structure.

By embodiments of the present invention, optimization of the grating layer beyond maintaining the grating structure is the key to maintaining an ohmic resistance character to the material outside of the active region, and the key development was the extended low-temperature growth which compensates the impurities and interface states at the regrowth interface.

Note at the outset that the discussion to follow regarding embodiments of the present invention should not be construed as limiting the application to such embodiments. Indeed, devices and components apart from optical transmitters and transceiver modules that employ laser devices and other suitable light sources can also benefit from the teachings to be discussed herein.

1. Exemplary Operating Environment

Figure 1:
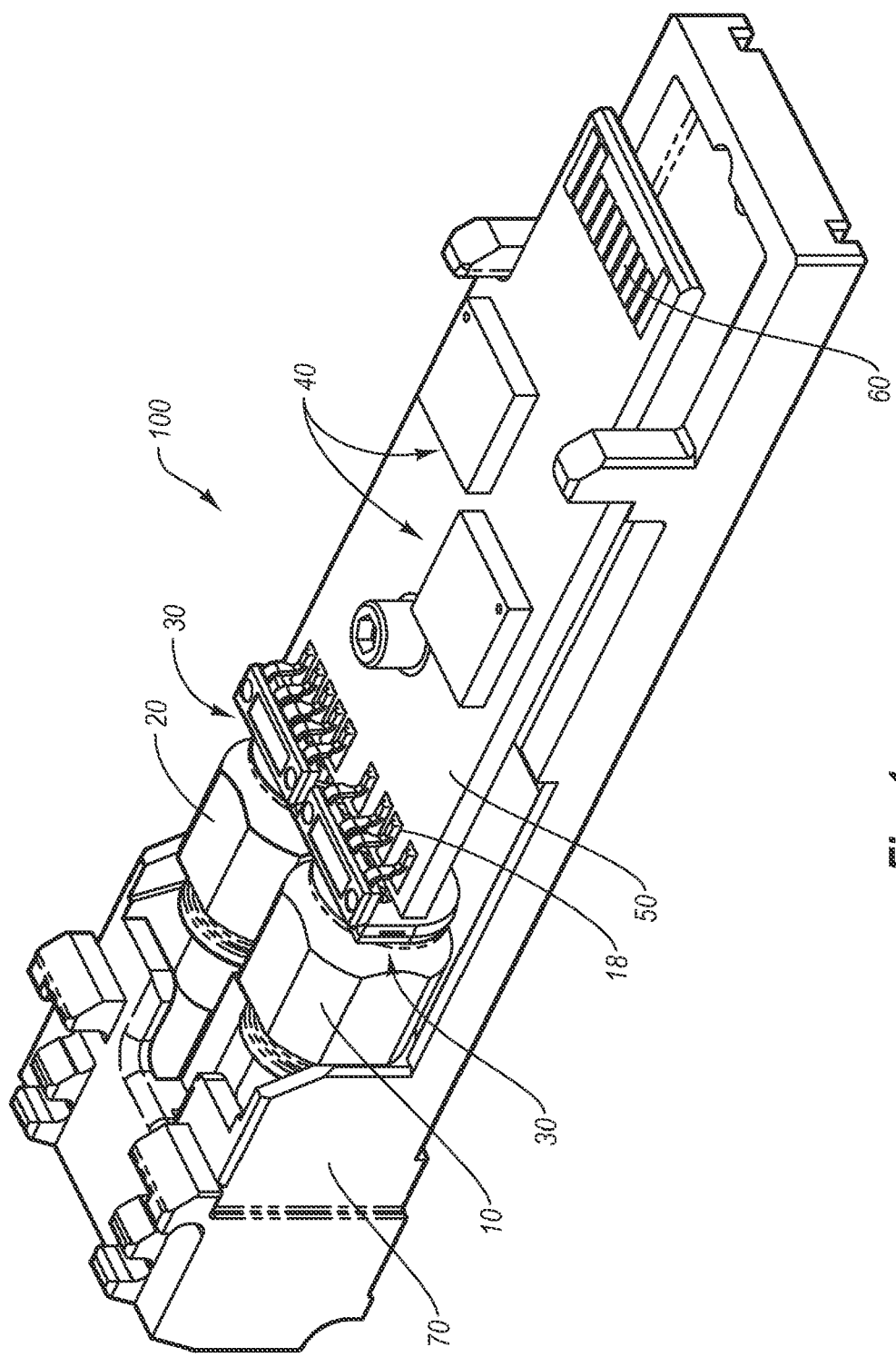
FIG. 1 is a perspective view of an optical transceiver module that serves as one exemplary environment in which embodiments of the present invention can be practiced.

Reference is first made to FIG. 1, which depicts a perspective view of an optical transceiver module ("transceiver"), generally designated at 100, for use in transmitting and receiving optical signals in connection with an external host that is operatively connected in one embodiment to a communications network (not shown). As depicted, the transceiver shown in FIG. 1 includes various components, including a receiver optical subassembly ("ROSA") 10, a transmitter optical subassembly ("TOSA") 20, electrical interfaces 30, various electronic components 40, and a printed circuit board ("PCB") 50. In detail, two electrical interfaces 30 are included in the transceiver 100, one each used to electrically connect the ROSA 10 and the TOSA 20 to a plurality of conductive pads 18 located on the PCB 50. The electronic components 40 are also operably attached to the PCB 50. An edge connector 60 is located on an end of the PCB 50 to enable the transceiver 100 to electrically interface with a host (not shown here). As such, the PCB 50 facilitates electrical communication between the ROSA 10/TOSA 20, and the host. In addition, the above-mentioned components of the transceiver 100 are partially housed within a shell 70. Though not shown, the shell 70 can cooperate with a housing portion to define a covering for the components of the transceiver 100.

While discussed in some detail here, the optical transceiver 100 is described by way of illustration only, and not by way of restricting the scope of the invention. As mentioned above, the optical transceiver 100 in one embodiment is suitable for optical signal transmission and reception at a variety of per-second data rates, including but not limited to 1 Gbit, 2 Gbit, 2.5 Gbit, 4 Gbit, 8 Gbit, 10 Gbit, or higher rates. Furthermore, the principles of the present invention can be implemented in optical transmitters and transceivers of shortwave and long wave optical transmission and any form factor such as XFP, SFP and SFF, without restriction.

The TOSA 20 of the transceiver 100 is one example of an optical transmitter that can employ an optical source, such as a semiconductor laser, that is configured according to embodiments of the present invention. Briefly, in operation the transceiver 100 receives electrical signals from a host (not shown) or other data signal-producing device to which the transceiver is operably connected for transmission onto an optical fiber operably connected to the TOSA 20. Circuitry of the transceiver 100 drives a laser (described below) within the TOSA 20 with signals that cause the TOSA to emit onto the optical fiber optical signals representative of the information in the electrical signal provided by the host. Accordingly, the TOSA 20 serves as an electro-optic transducer.

Having described a specific environment with respect to FIG. 1, it will be understood that this specific environment is only one of countless architectures in which the principles of the present invention may be employed. As previously stated, the principles of the present invention are not intended to be limited to any particular environment.

2. Aspects of a Method for Producing Laser Epitaxial Regrowth

Figure 2:
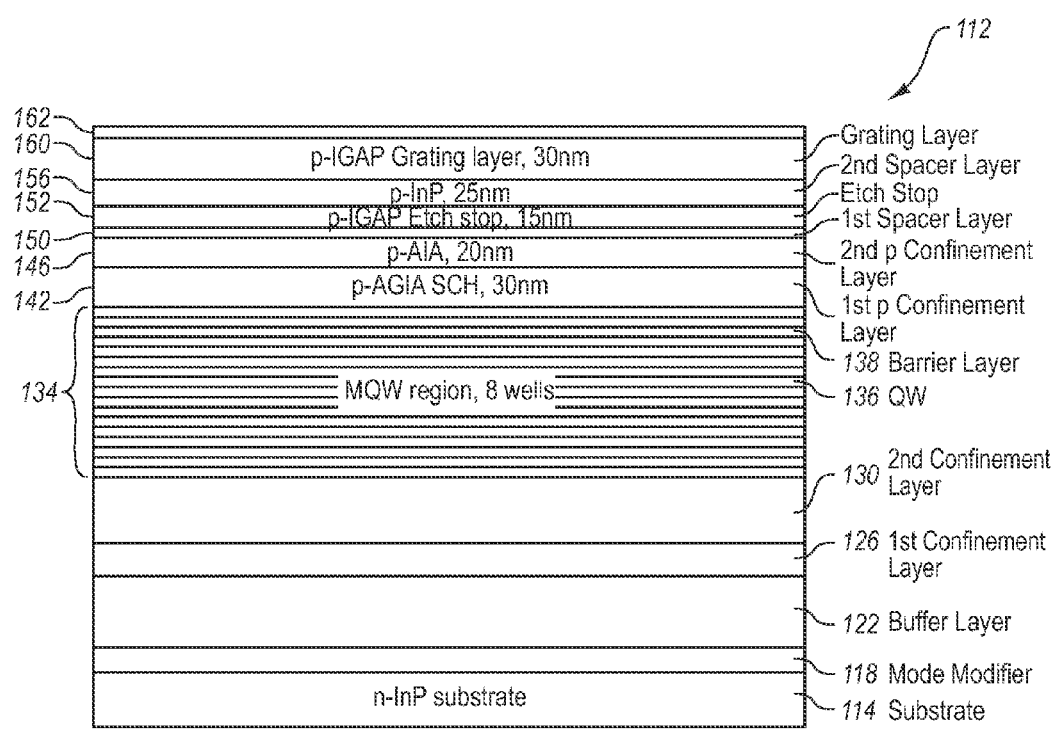
FIG. 2 is a cross sectional side view of an epitaxial base portion of a distributed feedback ("DFB") laser, according to one embodiment of the present invention.
Figure 3:
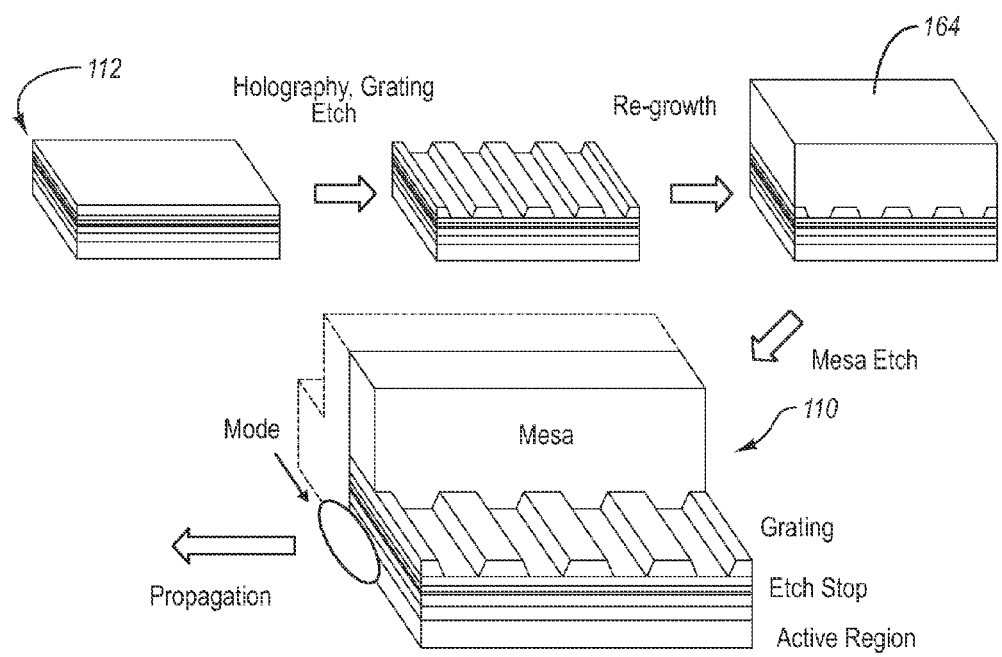
FIG. 3 is a progressive view of various processing and manufacture stages performed on the epitaxial base portion shown in FIG. 2.

Together with FIG. 1, reference is now made to FIGS. 2 and 3. In general, the operating environment described above, including the transceiver 100 and TOSA 20, is exemplary of one environment in which a laser device produced in part according to principles of the present invention can be employed. In particular, embodiments of the present invention disclose a method for producing an optimized doping profile for regrowth of layers over an epitaxial base portion during manufacture of a distributed feedback laser.

A distributed feedback ("DFB") laser is one example of a semiconductor optical device employed according to embodiments of the present invention. By way of general overview, a DFB laser contains a cavity having an active medium and a distributed reflector that operates in a wavelength range of the laser action. The DFB laser has multiple modes, including both longitudinal and transversal modes, but one of these modes will typically offer better loss characteristics relative to the other modes. This single mode typically defines a single-frequency operation of the DFB laser.

The following description provides various details regarding a ten gigabit/second ("10G") DFB laser configured for light emission at a wavelength of approximately 1310 nm. The following description includes both structural and functional characteristics of the 10G DFB laser, together with certain details regarding the manufacturing processes used to build the laser. Note, however, that this description is meant to be exemplary only; indeed, lasers and other semiconductor optical devices having structural and/or functional aspects that differ from the present description can also benefit from the principles of embodiments of the present invention as disclosed herein. It is also appreciated that additional or alternative layers, layer thicknesses, or structures can be incorporated into the present laser device as will be understood by those of skill in the art. The following discussion is therefore not intended to limit the present invention in any way.

a. Base Epitaxial Layers

FIG. 2 illustrates layers of a base epitaxial portion 112 of a 10G DFB laser, generally designated at 110, at a stage prior to etching of the grating layers. The DFB laser 110 is grown on an Indium Phosphide substrate (n-InP substrate) 114.

A "mode modifier" layer (n-IGAP Mode Modifier) 118 is grown on top of the substrate 114 using Indium Gallium Arsenide Phosphide at an approximate thickness of 120 nm. This layer functions to reduce the power of second-order transversal modes that propagate within the laser structure. In particular, the mode modifier layer 118 effectively increases the loss associated with these second-order transverse modes and couples the modes away from the gain medium of the laser. This suppression of second-order transverse modes allows for wider mesa widths on the laser because the laser is less sensitive to these modes.

A buffer layer (n-InP) 122 is made of Indium Phosphide and grown on top of the "mode modifier" layer 118. This buffer layer is approximately 1.4 µm thick and provides a surface on which the n-layers of the laser are grown.

A first n-confinement layer 126 of Aluminum Indium Arsenide (n-MA) is grown at a thickness of approximately 20 nm on the buffer layer and is doped with silicon. A second n-confinement layer 130 of Aluminum Gallium Indium Arsenide (n-AGIA SCH) is grown at a thickness of 30 nm on the n-MA layer and is also doped with silicon. Both of these layers are current confinement layers and effectively maintain electrons within the laser active region so that photons are produced. The n-AGIA SCH second n-confinement layer 130 is graded to improve the confinement characteristics of the layer. The thicknesses of these n-layers were designed to be thin in order to optimize the thermal performance of the laser.

A multi-quantum well active region (MQW region) 134 is grown on the n-type confinement layers. The active region 134 is designed to have eight wells 136 with corresponding wavelengths of ~1295 nm. Quantum barriers 138 between the wells have corresponding wavelengths of approximately 980 nm. Standard barrier wavelengths are in the range of 1060-1090 nm and thus have smaller barrier heights than the present multi-quantum-well design. The depth and width of the wells are designed to produce a 1310 nm photon. The active region is designed to be "strain compensated" which means that the barriers are designed to have opposing strain characteristics relative to the well strain characteristics. As a result, the strain generated from the barriers at least partially cancels the strain generated by the wells and reduces the overall strain on the layer. The present well design is intentionally manufactured so that a complete cancellation of strain does not occur, but a small amount of strain remains for performance reasons.

In addition, the layers of the MQW region 134 are intentionally doped with Zn, to maintain a low-level p-type doping. This is done to assure that the p-n junction of the laser diode always occurs in the same place, and is not made variable by unpredictable dopant diffusion processes. Further details regarding the doping of the MQW region 134 will be given below.

A first p-confinement layer 142 of Aluminum Gallium Indium Arsenide (p-AGIA SCH) is grown on the active region at a thickness of 30 nm and is doped with zinc. A second p-confinement layer 146 of Aluminum Indium Arsenide (p-MA) is grown at a thickness of 20 nm on the p-AGIA SCH layer and is also doped with zinc. Both of the p-layers are confinement layers and effectively maintain holes within the active region so that photons are produced. The p-AGIA SCH layer 142 is graded to improve the confinement characteristics of the layer. The thicknesses of these p-layers were designed to be thin in order to optimize the speed and thermal performance of the laser.

A spacer layer 150 is located above the p-confinement layers. This spacer layer is made of Indium Phosphide and is approximately 5 nm in thickness. The thinness of the spacer layer improves the coupling efficiency of the grating and improves the speed of the laser. In particular, the spacer layer effectively controls the degree to which lateral current spreading occurs between the bottom of the ridge mesa and the active region.

Various "above-active" grating layers are located above the spacer layer. An etch stop layer (p-IGAP etch stop) 152 made of Indium Gallium Arsenide Phosphide and having a thickness of 15 nm is grown on the spacer layer 150. This etch stop layer is provided for stopping the mesa etch.

A second spacer layer 156 is provided to separate the etch stop layer 152 and the grating layer. In the illustrated design, the grating etch step is timed to stop within this spacer layer. The layer is made of Indium Phosphide (p-InP) at a thickness of 25 nm.

A grating layer (p-IGAP) 160 is grown on the second spacer layer 156 and is made of Indium Gallium Arsenide Phosphide at a thickness of 30 nm. The grating layer is "above active" (as compared to other possible designs in which the grating is below the active region). Laser holography, wet etching, and subsequent InP regrowth, as explained further below, are used to create a uniform grating, consisting of alternating layers of high index IGAP and low index InP down the length of the laser cavity.

The laser cavity of the DFB laser 110 can support two degenerate longitudinal grating modes because the grating formed in the grating layer 160 is uniform (as opposed to, e.g., a quarter-wave shifted design). Selection of one or the other of these two modes is dependent upon the phase associated with the facet cleave, which is dependent upon the location of the cleave with respect to the grating period. Because the location of the cleave cannot be controlled with sufficient precision, all phase possibilities will be represented by any ensemble of devices of this design. As a result, there will always be a finite percentage of laser parts for which both grating modes are equally supported, resulting in inadequate single-mode behavior. These lasers are discarded and not sold.

A top layer 162 is provided above the grating layer on which regrowth of other layers is performed. This top layer is a thin layer of Indium Phosphide.

b. Grating Fabrication and Regrowth

FIG. 3 illustrates various grating fabrication and subsequent regrowth stages employed in forming portions of the structure of the DFB laser 110. In particular, FIG. 3 shows a side view of the base epitaxial structure 112 of FIG. 2, together with subsequent grating fabrication and regrowth of the DFB laser 110. As described above and by way of brief overview, a wet etch is performed to etch periodic gaps within the grating layer. After the etch is completed and the grating teeth are created, thick Indium Phosphide is grown on the etched, base epitaxial structure, in order to fill the gaps with low-index InP and also to form the mesa layer. The regrowth is completed with an Indium Gallium Arsenide layer for electrical contact.

This regrowth Indium Phosphide is used to create a mesa on the epitaxial base that provides current confinement and also functions as a waveguide, by virtue of lateral optical confinement. This structure is also referred to herein as a "ridge waveguide" structure. Photoresist is used to etch ridges on the regrowth that creates ridges to define the mesa of the DFB laser. Both dry and wet etching is used in creating the mesa ridges.

After the etching process, a dielectric layer is placed on the structure. In the present design, a "triple stack" of Silicon Nitride, Silicon Dioxide, and Silicon Nitride is used as the dielectric. This layer is typically thick in order to reduce parasitic capacitance (and improve speed) and is used to confine the current within the mesa.

The dielectric layer is removed from the top of the mesa to allow an electrical contact and metallic layer to be placed on the mesa. Electrical contact is made by depositing metal onto the Indium Gallium Arsenide layer at the top of the mesa. This contact is both a non-alloy contact and a low penetration contact.

A metallic layer is placed on the electrical contact to which electrical current may be provided to the laser structure. In the present embodiment, the metallic layer is made of three sub-layers of titanium, platinum and gold. A titanium layer is placed directly on the electrical contact layer, then a platinum layer and a gold layer is applied. This metallic layer provides sufficient conductivity to the Indium Gallium Arsenide layer so that current can be properly provided to the laser structure.

Bottom electrical contacts are generated by thinning the InP substrate and placing an n-type metallic layer on the bottom.

A DFB laser is removed from a wafer using common techniques by cleaving and breaking the wafer both horizontally and laterally to separate each laser. After this process, anti-reflective (AR) and high reflectivity (HR) coating is performed to encapsulate the active region of the laser and provide the requisite reflectivity characteristics of the laser cavity. The reflectivity characteristics define the optical power emitted from the back of the laser and the front of the laser. In uniform grating designs, a majority of the optical power is emitted from the front of the laser which couples into optical fiber. A minority of the optical power is emitted from the back of the laser which may couple with a photodetector (not shown) that is used to monitor the laser performance.

In one embodiment, the coatings are made of layers of Silicon Oxide and Silicon. The reflectivity of the AR coating is designed to be less that 0.5% and the HR coating is designed to be approximately 96%. Once the coating process is complete, a testing process is performed in which the power characteristics and optical spectrum are tested.

The DFB laser 110 and photodetector are packaged into an optical sub-assembly, which is subsequently packaged into an optical module along with driver and control integrated circuits.

Together with FIGS. 2 and 3, reference is now made to FIG. 4, which depicts various stages of a method for producing an optimized doping profile for growth of the regrowth layer 164 over the epitaxial base portion 112 during manufacture of the DFB laser 110. In particular, FIG. 4 shows a table detailing the various stages of the method, generally depicted at 170, according to one embodiment. By virtue of this method, relatively more p-type doping of the of the regrowth layer 164 can occur at a relatively lower temperature, thereby enabling the regrowth layer to be deposited to a relatively greater thickness before the remaining growth is continued at elevated temperatures. The present method also includes a particular temperature ramp profile for transitioning between low and high temperature growth processes. Other parameters of the regrowth profile that are manipulated in the present method include dopant concentration and initial regrowth temperature, as explained herein.

As mentioned above, the regrowth layer 164 is deposited atop the epitaxial base portion 112 after the grating is defined in the grating layer 160. According to a first recipe shown in column 1 of the table depicting the method 170 in FIG. 4, a first stage 172 of the method is performed, wherein a low temperature initiation layer of the regrowth layer 164 is formed at a substrate temperature of approximately 580 degrees Celsius to a thickness of about 300 Angstroms. At these conditions, effective phosphide cracking can occur, which condition is desirable for good regrowth layer formation. Doping of the regrowth layer is also begun at this stage, using a suitable p-type dopant, such as zinc.

At stage 176, a temperature ramp portion of the regrowth layer 164 is formed while transitioning the doping concentration and substrate temperature from the relatively low levels of stage 172 to higher levels in stage 180. Note that the temperature ramp profile is linear, while that of the doping is quadratic, according to the recipe in column 1.

In stage 180, deposition of InP as the regrowth layer 164 is continued at a temperature of approximately 660 degrees Celsius. Zinc doping is performed here at a concentration of about $8.00*10^{17}/cm^3$ to a depth of about 0.5 micrometers, then continued at a concentration of about $1.90*10^{18}/cm^3$ for the remainder of this stage. Note that the temperature used in this stage is optimum for regrowth crystal quality during practice of the present method according to the present embodiment.

In stage 184, an InGaAs contact layer is formed atop the regrowth layer 164 while zinc doping is continued at a concentration of about $1.10*10^{19}/cm^3$. Thickness of the contact layer achieved at this stage is approximately 200 nm.

In stage 188, an InP cap layer is deposited atop the contact layer while zinc doping is continued at a concentration of about $2.00*10^{18}/cm^3$. Thickness of the cap layer achieved at this stage is at least 10 nm and can be thicker in other embodiments.

In stage 192, the device is cooled to a temperature of approximately 300 degrees Celsius before phosphine flow is terminated and final cool-down occurs.

In another embodiment, the method 170 for doping and regrowth can also proceed according to another recipe as detailed in column 2 of the table. This recipe proceeds similarly to the recipe of column 1 with the following differences: The regrowth layer thickness achieved in stage 172 is approximately 900 Angstroms; the doping ramp shape in stage 176 is linear; and the zinc doping concentration in stage 184 is about $1.60*10^{19}/cm^3$.

Note that p-type dopants other than zinc can be employed for doping the regrowth layer. An example of such a dopant is beryllium.

The present invention may be embodied in other specific forms without departing from its spirit or essential characteristics. The described embodiments are to be considered in all respects only as illustrative, not restrictive. The scope of the invention is, therefore, indicated by the appended claims rather than by the foregoing description. All changes that come within the meaning and range of equivalency of the claims are to be embraced within their scope.

What is claimed is:

1. A method for depositing an InP regrowth layer on an epitaxial base portion of a distributed feedback laser, the method comprising:
    growing a first portion of the regrowth layer at an initial substrate temperature of approximately 580 degrees Celsius to a thickness between approximately 300 Angstroms and approximately 900 Angstroms;

increasing the substrate temperature from the initial substrate temperature to an increased substrate temperature of approximately 660 degrees Celsius;

growing a second portion of the regrowth layer at the increased substrate temperature; doping a first part of an uppermost layer of the regrowth layer at a concentration of approximately $8.00*10^{17}/cm3$ at the increased substrate temperature; and doping a second part of the uppermost layer of the regrowth layer at a concentration between approximately $1.90*10^{18}/cm3$ and approximately $2.00*10^{18}/cm3$ at the increased substrate temperature.

2. The method as recited in claim 1, wherein doping the regrowth layer at a concentration of approximately $8.00*10^{17}/cm3$ at the increased substrate temperature comprises doping the regrowth layer at a concentration of approximately $8.00*10^{17}/cm3$ at the increased substrate temperature to a thickness of approximately 0.5 um.

3. The method as recited in claim 1, wherein increasing the substrate temperature to approximately 660 degrees Celsius comprises increasing the substrate temperature to approximately 660 degrees Celsius with a linear temperature ramp profile.

4. The method as recited in claim 3, wherein increasing the substrate temperature to approximately 660 degrees Celsius with a linear temperature ramp profile comprises growing a third portion of the regrowth layer while increasing the substrate temperature to approximately 660 degrees Celsius with a linear temperature ramp profile.

5. The method as recited in claim 4, wherein growing a third portion of the regrowth layer comprises growing a third portion of the regrowth layer with a quadratic doping ramp profile.

6. The method as recited in claim 4, wherein growing a third portion of the regrowth layer comprises growing a third portion of the regrowth layer with a linear doping ramp profile.

7. The method as recited in claim 1, further comprising: growing a contact layer atop the regrowth layer; and doping the contact layer.

8. The method as recited in claim 7, wherein doping the contact layer comprises doping the contact layer at a concentration of about $1.10*10^{19}/cm3$.

9. The method as recited in claim 7, wherein doping the contact layer comprises doping the contact layer at a concentration of about $1.60*10^{19}/cm3$.

10. The method as recited in claim 7, wherein the contact layer is grown to a thickness of approximately 200 nm.

11. The method as recited in claim 7, further comprising:
depositing a cap layer atop the contact layer; and
doping the cap layer.

12. The method as recited in claim 11, wherein the cap layer is grown to a thickness of approximately 200 nm and wherein doping the cap layer comprises doping the cap layer at a concentration of about $2.00*10^{18}/cm3$.

13. The method as recited in claim 11, further comprising cooling the distributed feedback laser to a temperature of approximately 300 degrees Celsius.

14. The method as recited in claim 1, wherein the InP regrowth layer is deposited so as to substantially fill period gaps defined in a grating layer of the distributed feedback laser.

15. A method for depositing an InP regrowth layer on an epitaxial base portion of a distributed feedback laser, the method comprising:
growing a first portion of the regrowth layer at an initial substrate temperature of approximately 580 degrees Celsius to a thickness of approximately 300 Angstroms;
increasing the substrate temperature from the initial substrate temperature to an increased substrate temperature of approximately 660 degrees Celsius;
growing a second portion of the regrowth layer at the increased substrate temperature;
doping a first part of an uppermost layer of the regrowth layer at a concentration of approximately $8.00*10^{17}/cm3$ at the increased substrate temperature; and
doping a second part of the uppermost layer of the regrowth layer at a concentration between approximately $1.90*10^{18}/cm3$ and approximately $2.00*10^{18}/cm3$ at the increased substrate temperature.

16. The method as recited in claim 15, wherein increasing the substrate temperature to approximately 660 degrees Celsius comprises growing a third portion of the regrowth layer with a quadratic doping ramp profile while increasing the substrate temperature to approximately 660 degrees Celsius with a linear temperature ramp profile.

17. The method as recited in claim 15, further comprising:
growing a contact layer atop the regrowth layer; and
doping the contact layer at a concentration of about $1.10*10^{19}/cm3$.

* * * * *